United States Patent
Polomoff et al.

(10) Patent No.: US 10,068,859 B1
(45) Date of Patent: Sep. 4, 2018

(54) CRACK TRAPPING IN SEMICONDUCTOR DEVICE STRUCTURES

(71) Applicant: GLOBALFOUNDRIES INC., Grand Cayman (KY)

(72) Inventors: Nicholas A. Polomoff, Irvine, CA (US); Mohamed Rabie, Clifton Park, NY (US); Victoria L. Calero Diaz Del Castillo, Clifton Park, NY (US); Danielle Degraw, Hyde Park, NY (US); Michael Hecker, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/662,334

(22) Filed: Jul. 28, 2017

(51) Int. Cl.
  *H01L 23/58* (2006.01)
  *H01L 23/00* (2006.01)
  *H01L 23/544* (2006.01)

(52) U.S. Cl.
  CPC ......... *H01L 23/562* (2013.01); *H01L 23/544* (2013.01); *H01L 2223/5446* (2013.01)

(58) Field of Classification Search
  CPC ...... H01L 23/585; H01L 23/562; H01L 21/78
  See application file for complete search history.

(56) References Cited

U.S. PATENT DOCUMENTS

| | | | |
|---|---|---|---|
| 5,831,330 A | 11/1998 | Chang | |
| 7,109,093 B2 | 9/2006 | Fitzsimmons et al. | |
| 7,491,578 B1 | 2/2009 | Shaw et al. | |
| 7,544,602 B2 | 6/2009 | Clevenger et al. | |
| 7,646,078 B2 | 1/2010 | Jeng et al. | |
| 7,741,715 B2 | 1/2010 | Kim et al. | |
| 8,169,055 B2 | 5/2012 | Gillis et al. | |
| 8,232,648 B2 | 7/2012 | McGahay et al. | |
| 8,237,246 B2 | 8/2012 | Angyal et al. | |
| 8,912,076 B2 | 12/2014 | West et al. | |
| 2002/0024115 A1 | 2/2002 | Ibnabdeljalil et al. | |
| 2005/0098893 A1* | 5/2005 | Tsutsue | H01L 23/564 257/758 |
| 2008/0277765 A1 | 11/2008 | Lane et al. | |
| 2009/0108409 A1* | 4/2009 | Tsutsue | H01L 21/768 257/618 |
| 2009/0194850 A1* | 8/2009 | Kaltalioglu | H01L 21/78 257/620 |
| 2010/0109128 A1 | 5/2010 | West et al. | |
| 2011/0068435 A1 | 3/2011 | Hudson | |
| 2014/0070426 A1 | 3/2014 | Park et al. | |
| 2015/0325531 A1 | 11/2015 | Dyer et al. | |

* cited by examiner

Primary Examiner — Thomas L Dickey
(74) Attorney, Agent, or Firm — Scully Scott Murphy and Presser; Frank Digiglio

(57) ABSTRACT

A structure for arresting the propagation of cracks during the dicing of a semiconductor wafer into individual chips includes a monolithic metallic plate that traverses multiple dielectric layers peripheral to an active region of a chip. One or more metallic plates may be formed using lithography and electroplating techniques between the active device region and a peripheral kerf region, where each metallic plate includes a concave feature that faces the kerf region of the wafer.

16 Claims, 11 Drawing Sheets

CRACK TRAPPING IN SEMICONDUCTOR DEVICE STRUCTURES

BACKGROUND

The present disclosure relates generally to semiconductor device manufacture, and more specifically to crack stop architectures used to restrict crack propagation during the dicing of semiconductor wafers.

In conventional semiconductor device manufacturing, economies of scale, including decreased incidences of processing errors, increased throughput, and ease of handling, may be achieved through the simultaneous processing of a large number of integrated circuit (IC) chips on the surface of a single semiconductor substrate before the substrate is cut (or diced) into individual chips. The dicing process and the associated stresses, however, may create and propagate cracks into the active device region of the chips, resulting in device failure and decreased manufacturing throughput.

Various processes and structures have been implemented to reduce the number of chip failures due to crack propagation during dicing. Many conventional crack stop structures, for instance, are constructed during the formation of active device regions, and hence are built up layer-by-layer. However, such designs can create fragile interfaces between multiple sub-layers of the crack stop structure as well as the potential for misalignment and unlanded structures.

SUMMARY

Notwithstanding recent advances, the development of economical and effective crack stop methodologies to prevent crack propagation into active device regions of IC chips is desirable.

Current trends in device fabrication utilize layers of dielectric materials, e.g., low dielectric constant (low-k) materials, throughout a device structure to provide mechanical support as well as isolation between conductive structures and features. However, thin layers of dielectric materials are susceptible to cracking under applied loads, such as during processing and packaging operations. Chip dicing and stresses due to mismatched thermal coefficients of expansion, for example, can cause cracks to originate at chip edges. Propagation of the cracks into the active area of the chip can cause device failure.

As disclosed herein, a crack trapping design inhibits the propagation of cracks into the device active area. The crack trapping design includes a monolithic metallic plate that traverses multiple dielectric layers peripheral to an active region of a chip. One or more metallic plates located between the active device region and a peripheral kerf region may be formed using lithography and deposition techniques. In various embodiments, a crack trapping structure is constructed to completely surround the active region of a chip. An assembly of metallic plates may include a concave feature or notch that faces the kerf region of the wafer. A crack originating in the kerf region peripheral to the active region can enter the concave feature, where the propagation of the crack is then arrested by the crack stopping structure. As described further herein, the crack trapping structures are readily incorporated into conventional back end of the line (BEOL) processing.

In accordance with various embodiments, a semiconductor chip includes a semiconductor substrate having a device active area, plural dielectric layers disposed over the substrate peripheral to the device active area, and a crack trapping structure including a metallic plate extending around the device active area and through two or more of the dielectric layers.

According to further embodiments, a method of forming a semiconductor chip includes forming a device active area on a semiconductor substrate, and forming a plurality of dielectric layers within the device active area, the plurality of dielectric layers extending laterally over the semiconductor substrate peripheral to the device active area. The method further involves forming a via through the plurality of dielectric layers peripheral to the device active area and exposing the semiconductor substrate within the via, and forming a metallic plate within the via.

BRIEF DESCRIPTION OF SEVERAL VIEWS OF THE DRAWINGS

The following detailed description of specific embodiments can be best understood when read in conjunction with the following drawings, where like structure is indicated with like reference numerals and in which.

DETAILED DESCRIPTION

Figure 1:
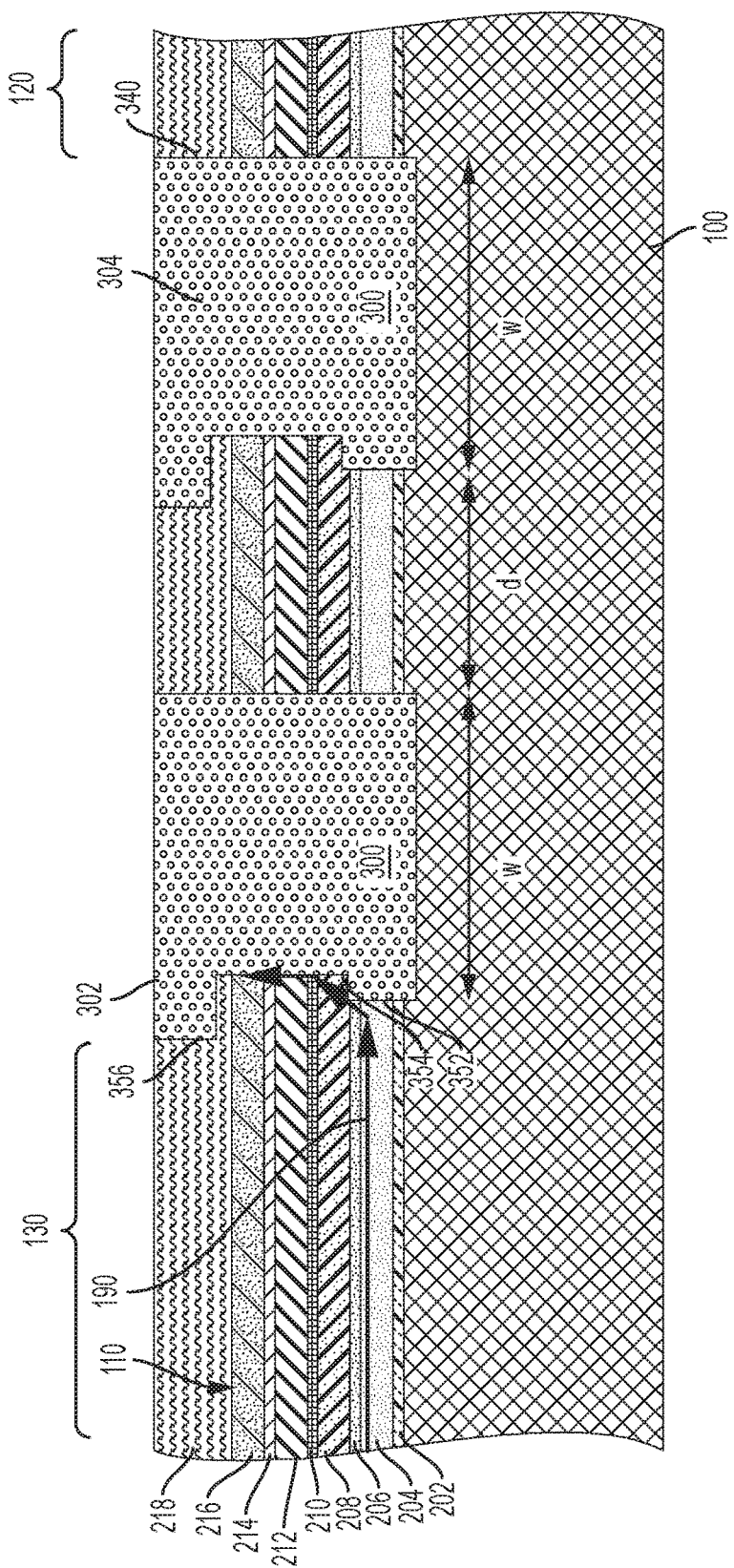
FIG. 1 is a schematic cross-sectional diagram showing an active region and a kerf region of a semiconductor substrate and a pair of crack trapping structures according to various embodiments.

Reference will now be made in greater detail to various embodiments of the subject matter of the present disclosure, some embodiments of which are illustrated in the accompanying drawings. The same reference numerals will be used throughout the drawings to refer to the same or similar parts.

Embodiments of the present disclosure relate to a crack trapping structure that includes at least one metallic plate that traverses multiple dielectric layers peripheral to an active region of an IC chip, i.e., between the active region and a kerf region surrounding the active region. Multiple inlaid metallic plates may be used to form a crack trapping structure that, in various embodiments, includes a stepped feature or notch that faces the kerf region of the wafer. According to various embodiments, a robust crack stop/crack trapping architecture is provided by a solid wall construction that incorporates fewer junctions than conventional structures. As will be explained further herein, the crack trapping structure in combination with the stepped feature, if provided, is adapted to halt propagating cracks and prevent their entry into the active region. As used herein, a "kerf region" refers to a scribing area or a dicing channel, for example, as well as a region from which material is lost during scribing or dicing. A "trapping region" refers to a portion of a crack trapping structure into which a crack may propagate, but from which further crack propagation is halted.

Figure 2:
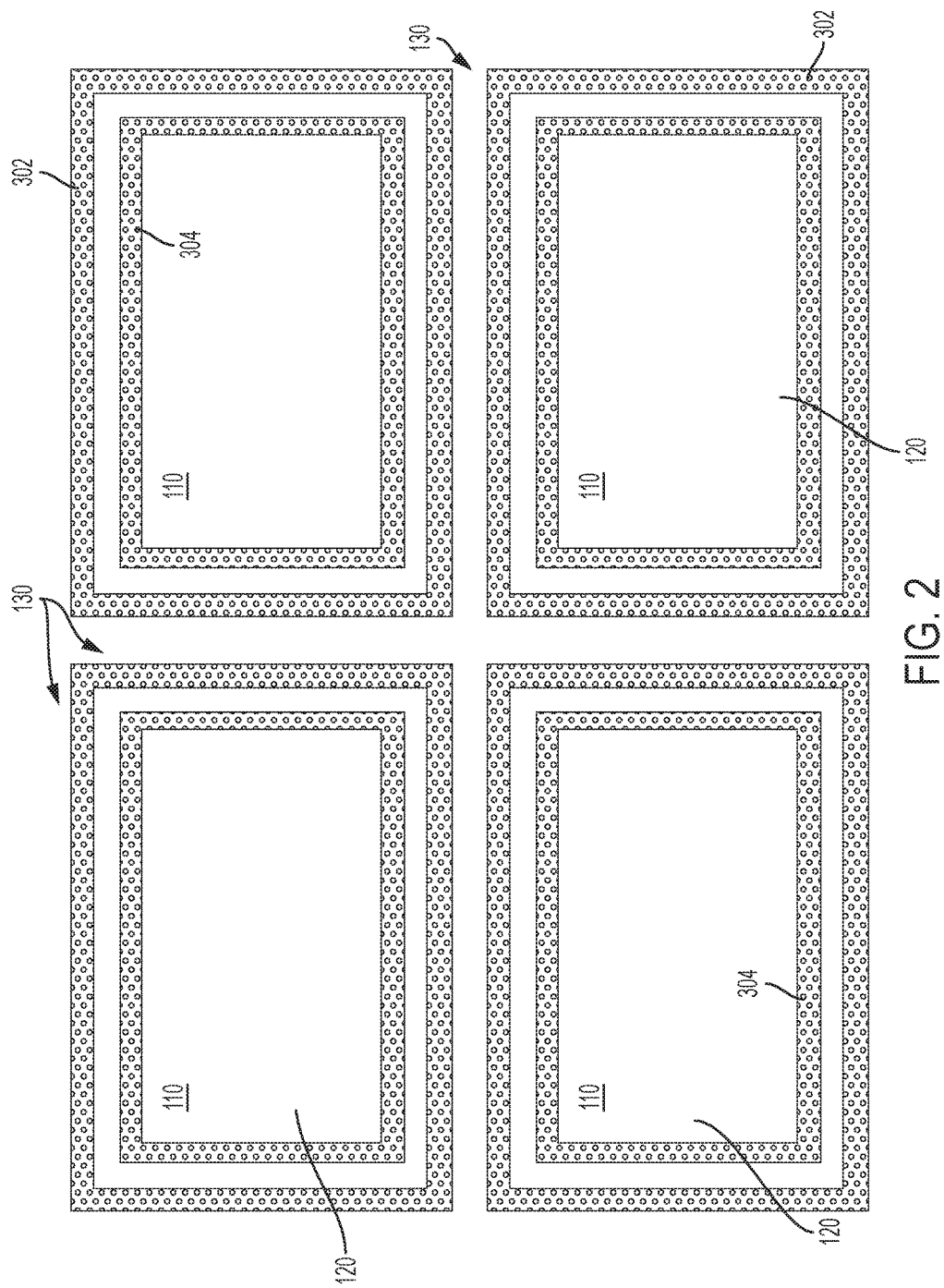
FIG. 2 is a top down plan view showing active device regions and adjacent kerf regions separated by pairs of concentric crack trapping structures according to various embodiments.

Referring to FIG. 1, a schematic cross-sectional diagram shows a portion of a semiconductor substrate 100 following the manufacture of an integrated circuit chip 110 thereon. The IC chip 110 includes an active region 120 that contains device circuitry (not shown) such as transistors, diodes, resistors, and the like, as is known to those skilled in the art. As seen also with reference to FIG. 2, which is a top-down plan view of an exemplary device layout, a pair of crack trapping structures 302, 304 are located peripheral to chip 110 and extend through plural dielectric layers 202, 204, 206, 208, 210, 212, 214, 216, 218 between the active region 120 and a kerf region 130. As will be appreciated, a device may be constructed with fewer or greater numbers of dielectric layers. Furthermore, while various embodiments are described herein with reference to a pair of crack trapping structures, an IC chip may be manufactured having a single, peripheral crack trapping structure, or multiple (e.g., 3 or more) peripheral crack trapping structures.

After the integrated circuit formation process, the substrate 100 can be diced within kerf region 130 to separate individual die from one another for packaging or for use in an unpackaged form within larger circuits. Common techniques that are used for wafer dicing include scribing, sawing and laser dicing.

Scribing typically involves the application of a diamond-tipped tool to the substrate surface along pre-defined scribe lines, which extend along the gaps (or "streets") between adjacent die. The scribe scores the wafer surface along the streets and, with the application of pressure, the wafer separates along the scribe lines. For instance, the breaks in the wafer may follow crystal lattice planes of the semiconductor substrate. Typically, scribing is used for thinner substrates, e.g., 0.25 mm thick or less. Sawing, on the other hand, is commonly used to dice thicker substrates.

With sawing, a diamond tipped saw rotating at a high number of revolutions per minute contacts the wafer surface and cuts the wafer within the kerf region along the streets. During sawing, the wafer may be mounted on a supporting member such as an adhesive film stretched across a frame such that the saw may be successively applied to mutually orthogonal (e.g., vertical and horizontal) streets.

A laser or plasma can make a cut within the dicing channels that is narrower than a saw blade, but typically the cutting rate of a laser or the etching rate of a plasma is slow compared to the cutting rate of a scribe or saw. Still further wafer dicing methods including combinations of the foregoing, e.g., combinations of mechanical scribing or sawing and laser cutting.

During a dicing operation, a crack may originate at a cut edge of an IC chip, e.g., within the kerf region 130. However, according to various embodiments, propagation of the crack through one or more of the dielectric layers 202-218 is halted when the crack tip reaches a crack trapping structure 302, 304. Without wishing to be bound by theory, the disclosed crack trapping structures leverage a propagating crack's tendency to follow the path of least resistance, i.e., lowest energy. In various embodiments, the crack trapping structure geometry directs and diverts a propagating crack into an engineered cavity or tomb where the crack becomes surrounded by solid walls with no seams or weak points for it to break through.

Referring again to FIG. 1, crack trapping structures 302, 304 traverse the entire stack of dielectric layers 202-218 such that the advancing crack cannot avoid the crack trapping structures, and thus does not propagate into the active device region 120. In FIG. 1, the path of a hypothetical crack is highlighted by arrows 190. In the illustrated embodiment, each crack trapping structure 302, 304 includes one or more metallic plates that extend collectively and continuously from a surface of the substrate 100 through dielectric layers 202-218. The hypothetical crack of FIG. 1 may propagate along an interface between adjacent dielectric layers, for example, until it meets crack trapping structure 302, and is directed within a recessed region thereof to an angled portion (e.g., internal corner) of the crack trapping structure 302 at which point the crack is unable to propagate further.

In various embodiments, substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 200 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

Dielectric layers 202-218 may comprise silicon nitride, silicon dioxide, or silicon oxynitride, for example, or a low-k dielectric material such as amorphous carbon, a fluorine-doped oxide, a carbon-doped oxide, SiCOH or SiBCN. As used herein, a "low-k" dielectric material has a dielectric constant less than that of silicon dioxide. Further dielectric materials include ultra low-k dielectrics, such as microporous and ordered mesoporous materials. Example microporous materials include natural and synthetic alumina silicates (i.e., zeolites). Ordered mesoporous materials may be formed using molecular templates such as surfactants or amphiphilic block copolymers where the copolymers aggregate into supramolecular micelle structures around which an inorganic precursor condenses to form an organic-inorganic composite from which the organic component can be removed by calcination.

As will be appreciated, the compounds silicon nitride and silicon dioxide have compositions that are nominally represented as $Si_3N_4$ and $SiO_2$, respectively. The terms silicon nitride and silicon dioxide, refer to not only these stoichiometric compositions, but also to nitride and oxide compositions that deviate from the stoichiometric compositions.

During the course of device manufacture, i.e., during manufacture of structures within the active areas, the dielectric layers 202-218 may be formed also outside of the active areas, e.g., within the kerf region. Dielectric layers 202-218 may be formed by chemical vapor deposition (CVD), atomic layer deposition (ALD) or spin-on coating, for example.

According to various embodiments, exemplary crack trapping structures 302, 304 comprise one or more metallic plates that may be formed in succession using conventional lithography and deposition techniques. The crack trapping structures may be formed by creating interconnected openings (e.g., vias, trenches, etc.) through the dielectric layers 202-218 and filling the openings with a metal. According to various embodiments, the metallic plates of the crack trapping structures comprise copper metal (Cu) or alloys thereof, although other metals such as aluminum (Al) may be used in lieu of, or in addition to, copper.

A variety of processes may be used to deposit a metal such as copper (Cu) into the vias and trenches. In certain embodiments, a chemical vapor deposition (CVD) process may be used. In further embodiments, a physical vapor deposition (PVD) process such as sputtering may be used. With such processes, excess metal may be removed using a polishing technique such as chemical mechanical polishing. Alternately, copper layers may be formed using an electrode-based deposition process such as plating (e.g., electroplating).

In various embodiments, crack trapping structures 302, 304 present a continuous solid metal barrier to an advancing crack. In exemplary embodiments, a crack trapping structure may have height that extends from the semiconductor substrate 100 through the entire stack of dielectric layers (e.g., 10 to 30 microns), and have a width (w) of 5 to 10 microns. In embodiments where more than a single peripheral crack trapping structure is provided around a given chip, a spacing (d) between crack trapping structures may range from 5 to 10 microns.

According to certain embodiments, crack trapping structures 300 include an uninterrupted vertical or substantially vertical sidewall 340 that faces the active device region 120, and an opposing, stepped sidewall comprising sidewall segments 352, 354, 356 that face the kerf region 130. Without wishing to be bound by theory, a stepped sidewall that includes both vertical or substantially vertical portions as well as horizontal or substantially horizontal portions creates a crack trapping architecture where a propagating crack can terminate. As used herein, "substantially vertical" and "substantially horizontal" features may deviate from vertical or horizontal by 10° or less, e.g., 0, 2, 5 or 10°, including ranges between any of the foregoing values.

Exemplary methods of forming a crack trapping structure 300 between active and kerf regions of a semiconductor substrate that extends through a plurality of dielectric layers are described herein with particular reference to FIGS. 3 and 4. Referring to FIG. 3A, shown is a schematic cross-sectional view of plural dielectric layers 202-218 formed over a semiconductor substrate 100 between an active region 120 of a chip and an adjacent kerf region 130 prior to dicing.

Figure 3A:
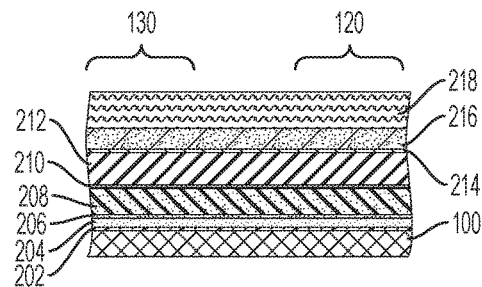
FIG. 3A is a schematic cross-sectional view of plural dielectric layers formed over a semiconductor substrate between an active region of a chip and an adjacent kerf region prior to dicing.
Figure 3B:
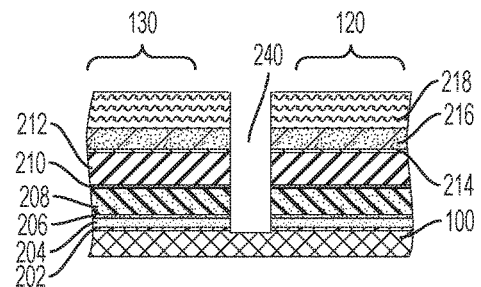
FIG. 3B shows the etching of a via through the dielectric layers to expose the semiconductor substrate between the active and kerf regions.

Referring to FIG. 3B, an opening (e.g., via) 240 that extends through the dielectric layers to the substrate may be formed using photolithographic patterning and etching processes known to those skilled in the art. Opening 240, which may be defined after completing the formation of structures (not shown) within the active device region 120, is formed between the active region 120 and a kerf region 130 of the substrate. Etching to form opening 240 may stop at a top surface of the substrate 100, or a portion of the substrate 100 may be removed (i.e., recessed) within opening 240.

In an example patterning and etching process, a layer of photoresist (not shown) is formed over the dielectric layers 202-218. The photoresist may include a positive-tone photoresist composition, a negative-tone photoresist composition, or a hybrid-tone photoresist composition. The layer of photoresist may be formed by spin-on coating.

The deposited photoresist layer is subjected to a pattern of irradiation, and the exposed photoresist material is developed utilizing a conventional resist developer. The pattern provided by the patterned photoresist material is thereafter transferred into the dielectric layers, and the photoresist is removed, e.g., by ashing.

The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used.

Figure 3C:
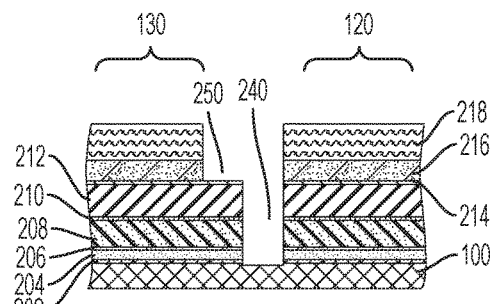
FIG. 3C shows etching of a trench adjacent to and extending laterally from the via of FIG. 3B and toward the kerf region to form an extended crack stop opening.

Referring to FIG. 3C, using further photolithographic patterning and etching processes, an additional opening (e.g., trench) 250 that extends through upper dielectric layers 216, 218 is formed adjacent to and contiguous with opening 240. A timed etch may be used to form the additional opening 250, or the additional opening 250 may be formed using an etch chemistry that removes upper dielectric layers 216, 218 selectively with respect to dielectric layer 214. As illustrated, the additional opening 250 is formed on the kerf region side of opening 240 to form an L-shaped crack stop opening 240, 250.

Figure 3D:
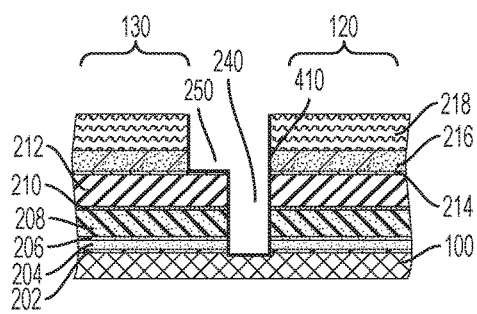
FIG. 3D depicts formation of a seed layer within the crack stop opening.
Figure 3E:
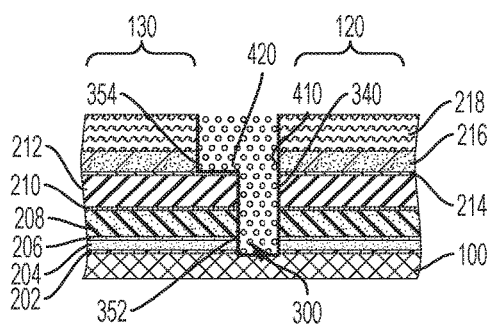
FIG. 3E shows plating of a crack trapping structure within the trench and the via.

Referring to FIGS. 3D and 3E, the openings 240, 250 may be backfilled with a metallic material such as copper. For instance, FIG. 3D depicts formation of a conformal seed layer 410 within the crack stop opening 240, 250, followed by the deposition of a fill layer 420 to form a crack trapping structure 300, as shown in FIG. 3E. A seed layer may be formed using chemical vapor deposition or physical vapor deposition, and may include, by way of example, a layer of tantalum, tantalum nitride, copper, titanium, titanium nitride, titanium tungsten, as well as multilayers of any of the foregoing. In turn, fill layer 420 may be formed by electroplating.

Crack trapping structure 300 comprises a monolithic metallic plate that traverses multiple dielectric layers peripheral to an active region 120 of a chip 110. Crack trapping structure 300 presents an uninterrupted, vertical sidewall 340 that faces the active device region 120, and a stepped sidewall comprising vertical sidewall segments 352, 354 that face the kerf region 130.

In embodiments where a top surface of the substrate is removed during the etch to form opening 240, the crack trapping structure 300 may be located such that a bottom-most surface of the crack trapping structure 300 is below a topmost surface of the substrate 100. Such a geometry may provide an anchoring effect for the crack trapping structure 300.

Figure 4A:
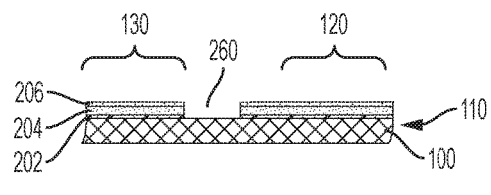
FIG. 4A is a schematic cross-sectional view of several dielectric layers formed over a semiconductor substrate and patterned to form an opening exposing portions of the substrate between an active region of a chip and an adjacent kerf region prior to dicing.

Further methods of forming a crack trapping structure are described with reference to FIGS. 4A-4I. Referring to FIG. 4A, a schematic cross-sectional view of a device architecture at an intermediate stage of fabrication shows several lower dielectric layers 202, 204, 206 formed over a semiconductor substrate 100, and patterned using the photolithographic patterning and etching processes described above to form an opening (e.g., trench) 260 that exposes the substrate between an active region 120 of a chip 110 and an adjacent kerf region 130 prior to dicing.

Figure 4B:
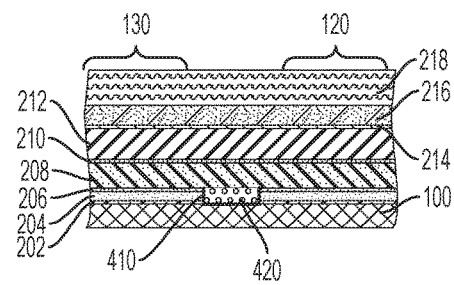
FIG. 4B shows plating of the opening of FIG. 4A prior to forming further dielectric layers over the semiconductor substrate to form a lower portion of a crack trapping structure.
Figure 4C:
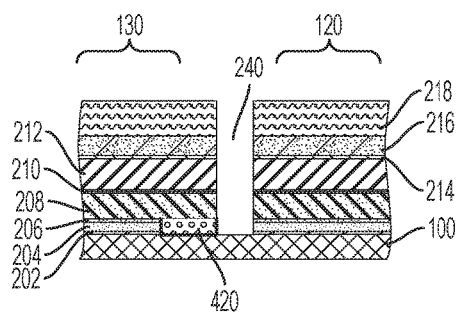
FIG. 4C shows etching through additional dielectric layers to form a via adjacent to the plated structure of FIG. 4B.
Figure 4D:
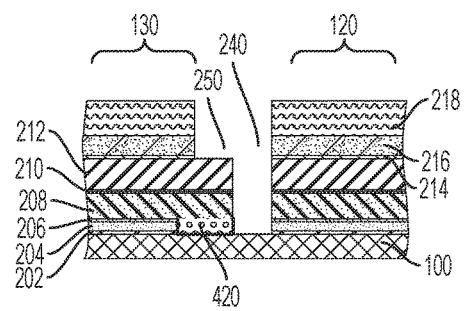
FIG. 4D shows the etching of a trench adjacent to and extending laterally from the via of FIG. 4C toward the kerf region and over the lower portion of the crack trapping structure to form an extended crack stop opening.
Figure 4E:
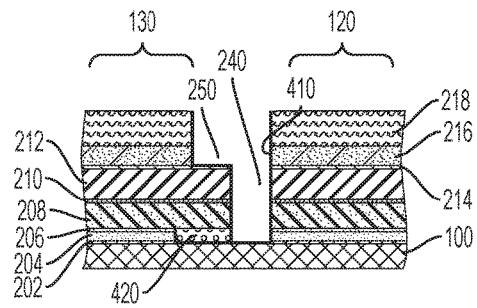
FIG. 4E depicts formation of a seed layer within the extended crack stop opening and the via.
Figure 4F:
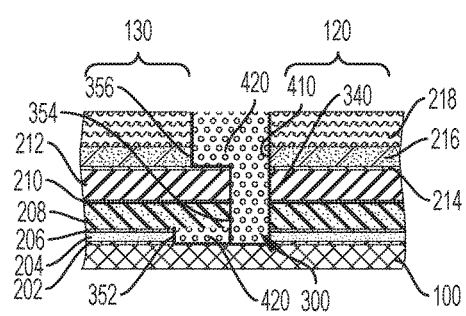
FIG. 4F shows plating of a crack trapping structure within the openings and the via according to various embodiments.

Referring to FIG. 4B, a metallic layer 420 is deposited within opening 260 to form a lower portion of a crack trapping structure prior to forming further dielectric layers 208-218 over the semiconductor substrate. In turn, FIG. 4C shows etching of the additional dielectric layers 208-218 as well as lower layers 202-206 to form a via 240 immediately adjacent to and on the active region side of the metallic structure of FIG. 4B. Referring to FIG. 4D, using still further photolithographic patterning and etching processes, an additional opening (e.g., trench) 250 is formed that extends through upper dielectric layers 214, 216, 218 adjacent to and contiguous with opening 240. Trench 250 is formed over the lower portion of the crack trapping structure. Then, referring to FIGS. 4E and 4F, a conformal seed layer 410 is formed within the openings 240, 250 and a metallic layer 420 is deposited to fill the openings.

Crack trapping structure 300 comprises an integrated assembly of monolithic metallic plates where at least one of the plates traverses multiple dielectric layers. Crack trapping structure 300 presents an uninterrupted, vertical sidewall 340 that faces the active device region 120, and a stepped sidewall comprising vertical sidewall segments 352, 354, 356 that face the kerf region 130.

Figure 4G:
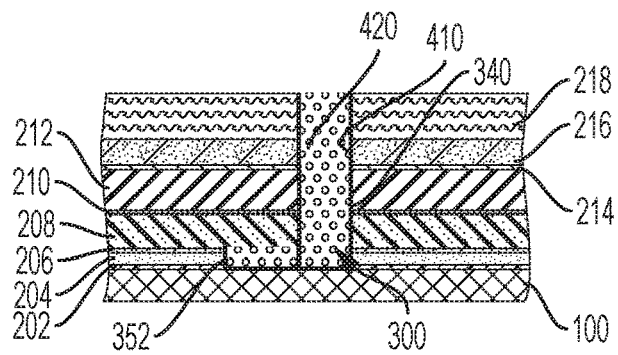
FIG. 4G shows plating of the via of FIG. 4C prior to forming the trench of FIG. 4D according to further embodiments.
Figure 4H:
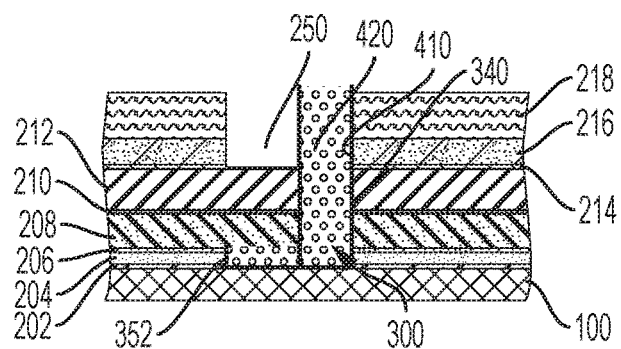
FIG. 4H shows etching of a trench adjacent to the plated structure of FIG. 4G and extending laterally from the plated via of FIG. 4G toward the kerf region and over the lower portion of the crack trapping structure to form an extended crack stop opening.
Figure 4I:
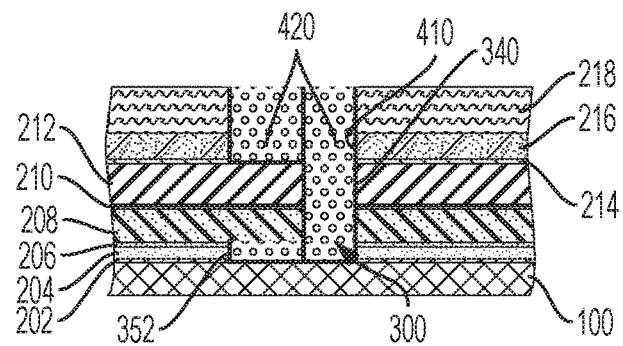
FIG. 4I shows formation of a seed layer and the subsequent plating of the extended crack stop opening to form a crack trapping structure according to further embodiments.

According to further embodiments, FIG. 4G shows deposition of a metal layer within the via 240 of FIG. 4C prior to forming the trench 250 of FIG. 4D. Thereafter, referring to FIG. 4H, trench 250 is formed adjacent to the plated structure of FIG. 4G, and a metal layer is deposited within trench 250 as shown in FIG. 4I. The trench 250 extends laterally from the plated via of FIG. 4G toward the kerf region 130 and overlies a lower portion of the crack trapping structure filling trench 260.

Figure 5:
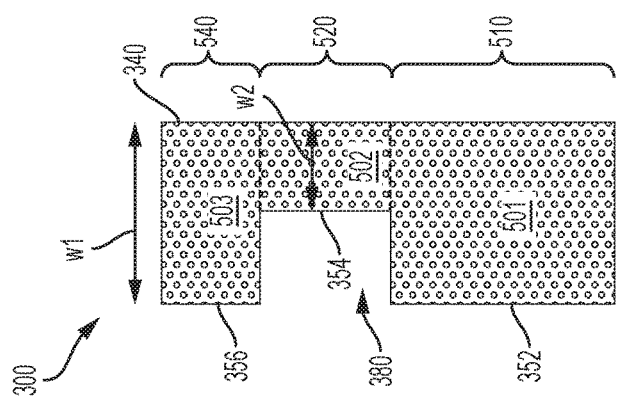
FIG. 5 depicts a crack trapping structure including a stepped feature facing a kerf region of a semiconductor substrate according to certain embodiments.

Referring now to FIGS. 5-10, illustrated are crack trapping structure geometries according to various embodiments. The crack trapping structures illustrated in FIGS. 5-10 include one or more metallic plates that are separately formed using patterning and deposition steps and joined in situ along the dashed lines shown in the figures. In FIG. 5, a crack trapping structure 300 includes three merged metallic plates 501, 502, 503, formed respectively within lower, intermediate and upper regions 510, 520, 540 of the crack trapping structure, where at least one of the plates 501, 502, 503 is configured to traverse two or more dielectric layers disposed over a semiconductor substrate. In certain embodiments, each metallic plate within the crack trapping structure traverses a plurality of dielectric layers. Thus, each metallic plate may be embedded within a multi-layer dielectric stack using the patterning, etching and deposition techniques described above.

The crack trapping structure of FIG. 5 has a first width (w1) within a lower region 510 as well as within an upper region 540, and a second width (w2) less than the first width within an intermediate region 520. The crack trapping structure 300 includes a substantially vertical sidewall 340 that is adapted to face the active region of a semiconductor substrate. Opposite the substantially vertical sidewall, the crack trapping structure 300 includes a stepped sidewall comprising vertical sidewall segments 352, 354, 356 defining a notch 380 that is configured to face the kerf region of the semiconductor substrate. In the illustrated structure, metallic plate 502 defines a sidewall surface of the notch 380, and metallic plates 501, 503 respectively define the bottom surface and the top surface of the notch. During manufacture, according to certain embodiments, a crack can propagate into notch 380 where it is trapped.

Figure 6:
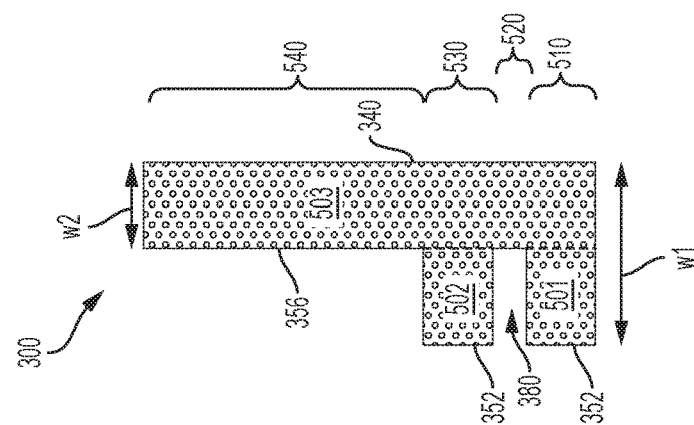
FIG. 6 depicts a further crack trapping structure including a stepped feature facing a kerf region of a semiconductor substrate according to certain embodiments.

Referring to FIG. 6, a crack trapping structure 300 according to a further embodiment includes three merged metallic plates 501, 502, 503. The crack trapping structure 300 includes a substantially vertical sidewall 340 that is adapted to face the active region of a semiconductor substrate, and a notch 380 configured to face a kerf region of a semiconductor substrate according to certain embodiments. Notch 380 is defined between an underlying first metallic plate 501, an overlying second metallic plate 502, and a laterally adjacent third metallic plate 503. In the illustrated structure, metallic plate 503 defines a sidewall surface of the notch 380, and metallic plates 501, 502 respectively define the bottom surface and the top surface of the notch. As used herein, the terms "lateral" and "laterally" refer to a direction parallel to a major surface of a substrate.

The crack trapping structure of FIG. 6 has a first width (w1) within a lower region 510 as well as within a first intermediate region 530. The crack trapping structure of FIG. 6 has a second width (w2) less than the first width (w1) within a second intermediate region 520 between the first intermediate region 530 and the lower region 510, as well as within an upper region 540. In the illustrated embodiment, first metallic plate 501 and third metallic plate 502 respectively cooperate with third metallic plate 503 to define the lower and the first intermediate regions 510, 530. During manufacture, according to certain embodiments, a crack can propagate into and become trapped within notch 380.

Figure 7:
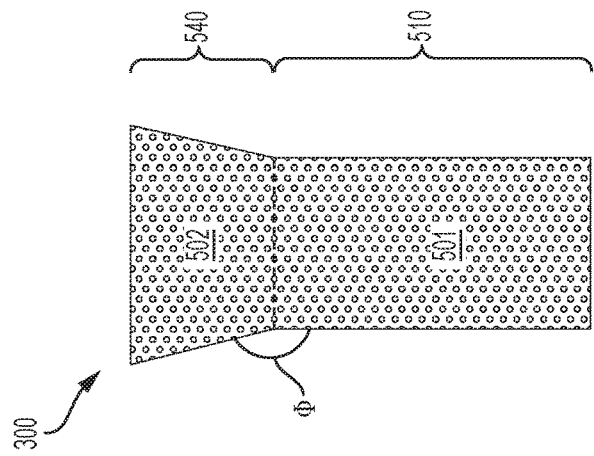
FIG. 7 shows a crack trapping structure having sloped sidewalls within an upper region thereof according to various embodiments.

According to further embodiments, the crack trapping structure of FIG. 7 has a first width (w1) within a lower region 510 defined by a first metallic plate 501, and variable width (w) within an upper region 540 defined by a second metallic plate 502, wherein the variable width of the crack trapping structure within the upper region 540 monotonically increases from the bottom to the top of the upper region. The vertical sidewall of the first metallic plate 501 intersects the sloped sidewall of the second metallic plate 502 at an angle $\phi$, where $90<\phi<180°$, e.g., 100, 120, 140, or 160°, including ranges between any of the foregoing values. During dicing, for example, and according to certain embodiments, a propagating crack can advance along the vertical sidewall of the first metallic plate or along the sloped sidewall of the second metallic plate and become trapped at the apex of the angle $\phi$.

Figure 8:
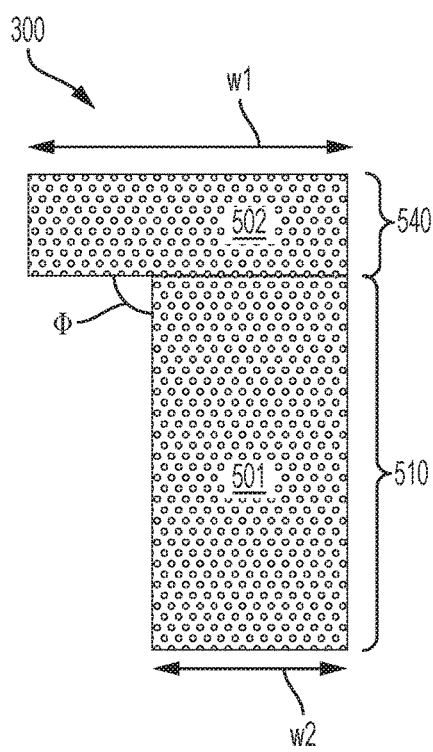
FIG. 8 is a crack trapping structure including an upper stepped feature according to further embodiments.

FIG. 8 shows a crack trapping structure 300 having a first metallic plate 501 defining a lower region 510, and a contiguous second metallic plate 502 defining an upper region 502, where a width (w1) of the upper region is greater than a width (w2) of the lower region. In the illustrated embodiment, lower metallic plate 501 and upper metallic plate 502 intersect at an angle $\phi$, where $45 \leq \phi \leq 90°$, e.g., 45, 55, 65, 75, 85 or 90°, including ranges between any of the foregoing values. In certain embodiments, the crack trapping structure 300 is configured to trap a propagating track in the corner defined by the intersection of the first and second metallic plates, i.e., at the apex of the angle $\phi$.

Figure 9:
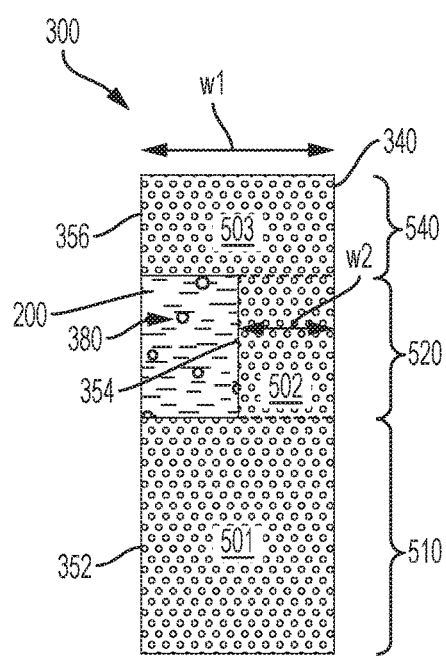
FIG. 9 is a crack trapping structure including a dielectric filled cavity facing a kerf region of a semiconductor substrate according to certain embodiments.
Figure 10:
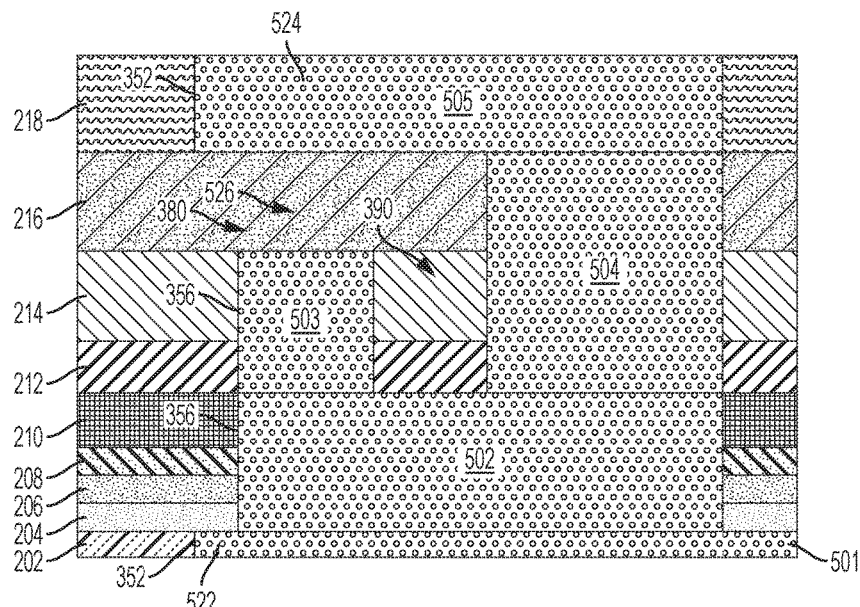
FIG. 10 is an example crack trapping structure including a tomb and an entrance channel leading to the tomb from a kerf region of a semiconductor substrate.
Figure 11:
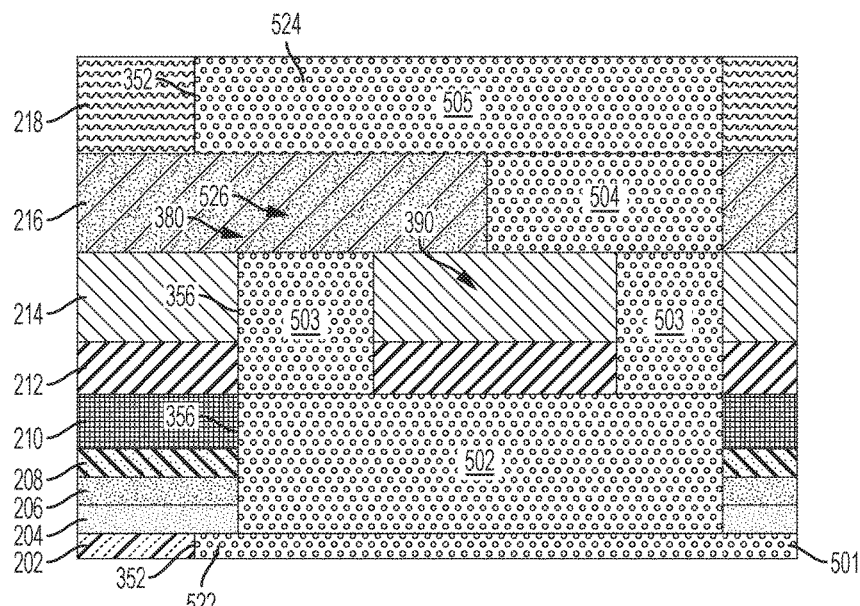
FIG. 11 is a crack trapping structure including a tomb and an entrance channel to the tomb that faces a kerf region of a semiconductor substrate according to further embodiments.
Figure 12:
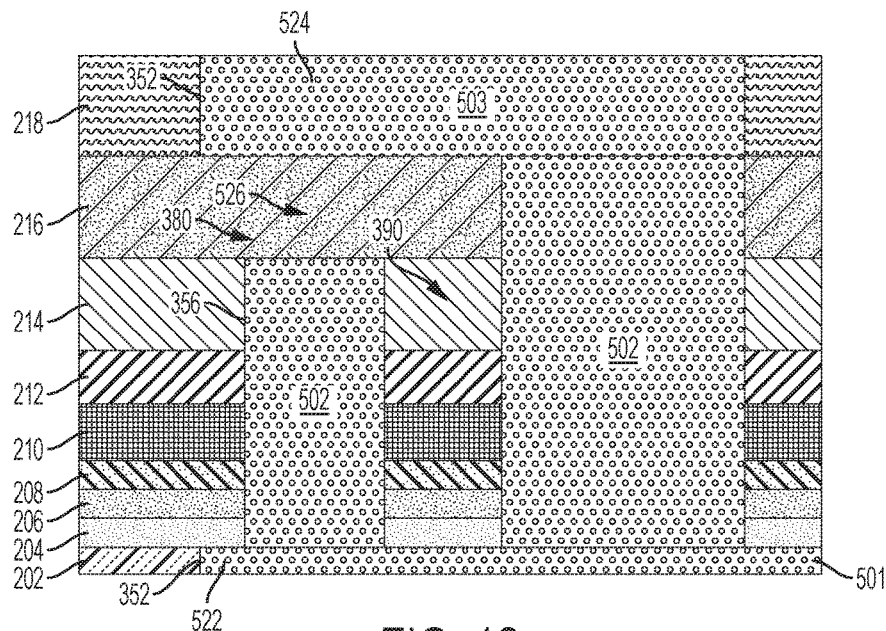
FIG. 12 shows a crack trapping structure having a tomb and an entrance channel located proximate to an upper region of the tomb according to still further embodiments.
Figure 13:
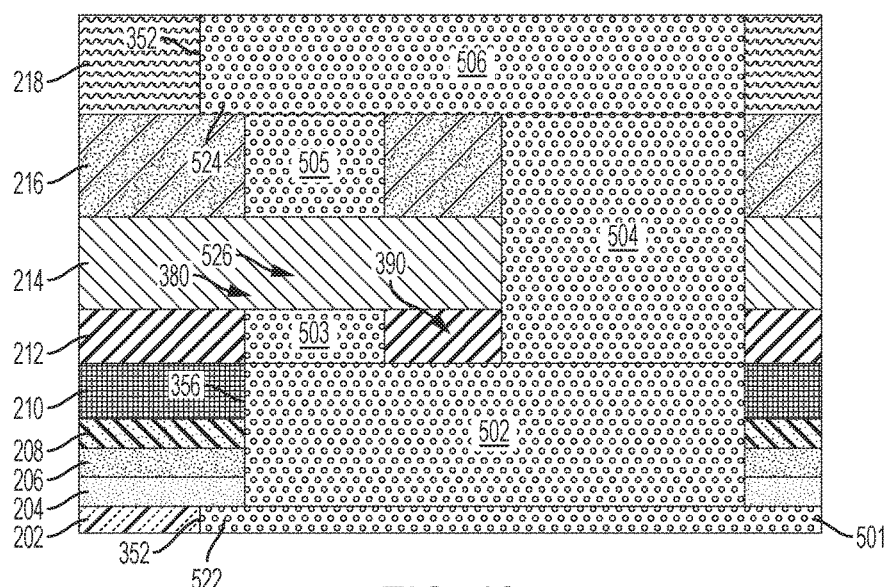
FIG. 13 depicts a crack trapping structure having a tomb and an entrance channel located at an intermediate region of the tomb.
Figure 14:
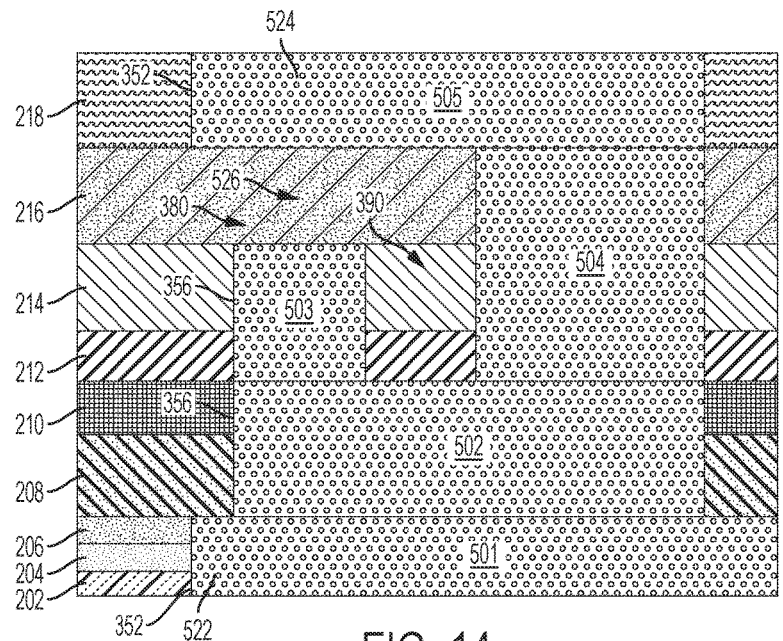
FIG. 14 shows a crack trapping structure having a tomb, an entrance channel located proximate to an upper region of the tomb, and a thicker lower shelf facing a kerf region of a semiconductor substrate.
Figure 15:
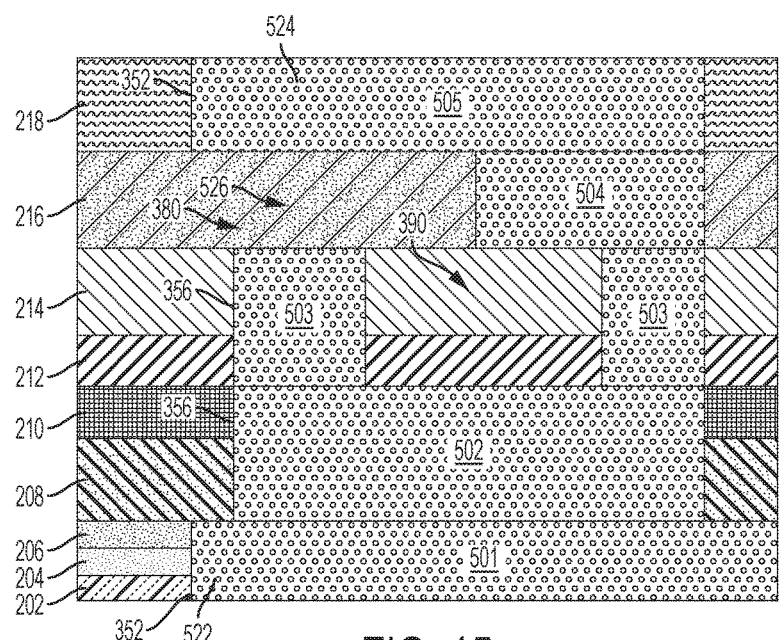
FIG. 15 shows a crack trapping structure having a tomb, an entrance channel located proximate to an upper region of the tomb, and a thicker lower shelf facing a kerf region of a semiconductor substrate according to further embodiments.
Figure 16:
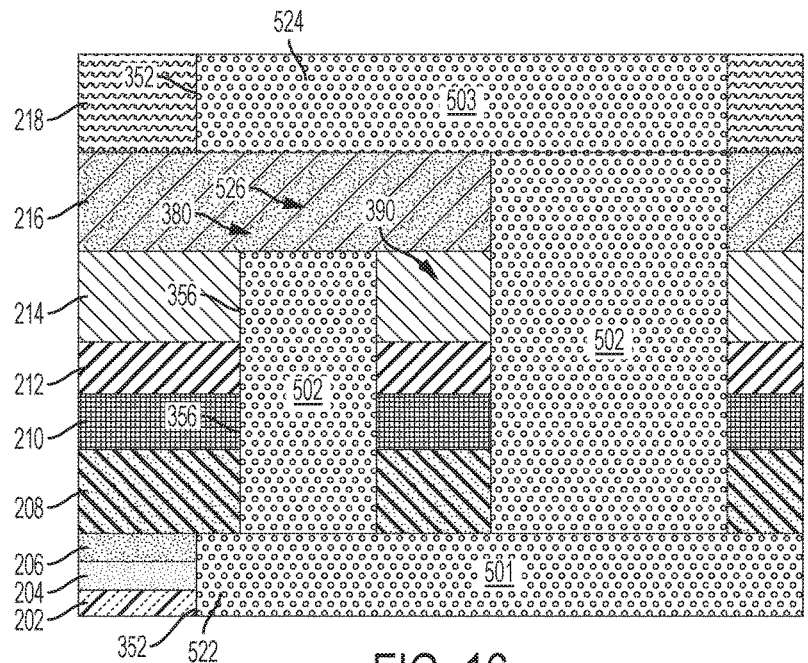
FIG. 16 shows a crack trapping structure having a tomb, an entrance channel located proximate to an upper region of the tomb, and a thicker lower shelf facing a kerf region of a semiconductor substrate according to still further embodiments.
Figure 17:
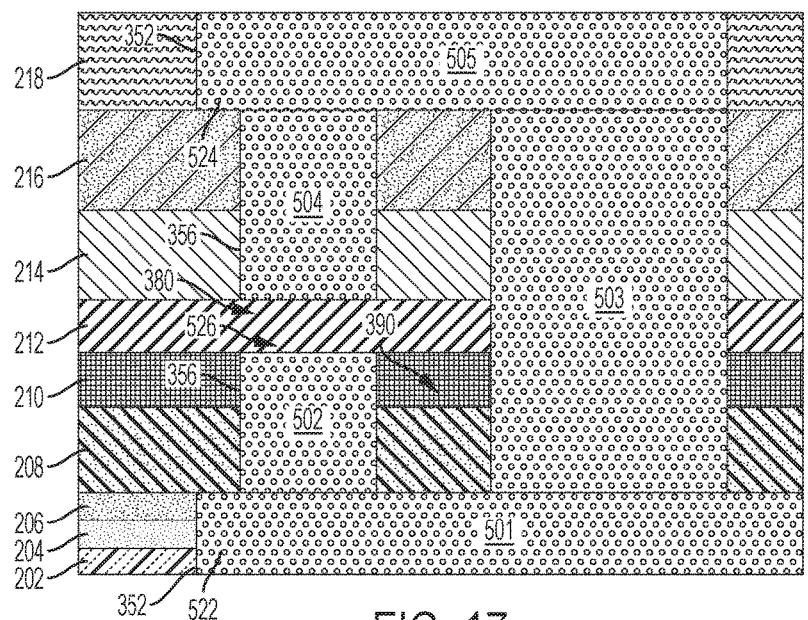
FIG. 17 depicts a crack trapping structure having a tomb, an entrance channel located at an intermediate region of the tomb, and a thicker lower shelf facing a kerf region of a semiconductor substrate.

FIG. 9 is a crack trapping structure 300 analogous to the crack trapping structure of FIG. 5, and further including a notch 380 that is filled with a dielectric layer 200. Dielectric layer 200 may be formed from the same dielectric material used to form any one of a laterally adjacent dielectric layer 202-218, or the dielectric layer 200 may comprise a different dielectric material. In certain embodiments, the dielectric material may comprise air or another gas such as nitrogen or argon. The dielectric-filled notch of the crack trapping structure of FIG. 9 provides a volume (i.e., within the notch 380) into which a propagating crack may enter, but from which the crack cannot escape.

As will be appreciated, and in accordance with various embodiments, the width (w1, w2, w3, etc.) of an individual metallic plate 501, 502, 503, etc. may independently vary from 4 to 10 microns, e.g., 4, 5, 6, 7, 8, 9 or 10 microns, including ranges between any of the foregoing values.

Referring to FIGS. 10-17, further embodiments of a crack trapping structure 300 include plural merged metallic plates 501, 502, 503, etc. formed across lower, intermediate and upper regions of the crack trapping structure, where at least one of the plates traverses two or more dielectric layers disposed over a semiconductor substrate.

The crack trapping structures 300 include a notch 380 that is laterally bounded by two or more of the metallic plates to form a tomb 390. During operation, a crack entering a tomb 390 through an entrance channel 526 is unable to reverse direction and is trapped within the tomb 390.

In each of the crack trapping structures of FIGS. 10-17, a lower shelf 522 and an overhang 524 cooperate to direct a propagating crack into the entrance channel 526 and into the tomb 390. Lower shelf 522 and overhand 524 are defined by a corresponding metallic plate having a width greater than a respective overlying or underlying metallic plate. That is, lower shelf 522 has a sidewall segment 352 that is laterally displaced with respect to a sidewall segment 356 of an overlying metallic plate, and overhang 524 has a sidewall segment 352 that is laterally displaced with respect to a sidewall segment 356 of an underlying metallic plate.

In the illustrated embodiments of FIGS. 10-17, the various metallic plates 501, 502, 503, etc. that define the crack trapping structures are embedded in plural dielectric layers 202, 204, 206, 208, 210, 212, 214, 216, 218.

Further to the foregoing, embodiments of the present disclosure relate to a method for preparing a mechanically robust integrated circuit chip as well as the associated structures. The mechanically robust chip resists the propagation of cracks that originate at the edges of the chip, e.g., during dicing operations through kerf regions containing multiple dielectric layers. Such cracks are prevented from reaching the chip's device active region.

The method involves manufacturing an integrated circuit chip on a semiconductor substrate. The chip includes a device active region having a peripheral region comprising a stack of dielectric layers. The method further comprises forming an opening in the dielectric layers to expose the semiconductor substrate and depositing a metallic layer within the opening and over (e.g., directly over) an exposed surface of the substrate. The crack trapping structure is thus located around the perimeter of the chip, outside of and operationally disconnected from the device active region.

A further embodiment relates to an electronic apparatus comprising an integrated circuit chip formed on a semiconductor substrate, the integrated circuit chip comprising a device active region having a peripheral region comprising a stack of dielectric layers. A crack trapping structure comprising a metallic plate that traverses two or more of the dielectric layers and abuts the substrate is formed peripheral to and operationally disconnected from the active region.

Effective crack trapping using the crack stop methods and structures as disclosed herein significantly increases the fracture toughness and mechanical stability of a chip-laden semiconductor substrate, which results in a lower failure rate and improved reliability of chips harvested from the substrate.

In particular embodiments, a mechanically robust integrated circuit chip is disclosed. The IC chip is formed on a semiconductor substrate and includes a device active region and one or more dielectric layers located peripheral to the active region. A crack trapping structure comprising a monolithic metallic plate is arranged around the perimeter of the active region and extends through the one or more dielectric layers to the substrate. A crack generated at an edge of the chip, e.g., during a dicing operation, and propagating through the dielectric layers is arrested by the crack trapping structure outside of the active region.

Although the above description relates generally to back end of the line (BEOL) structures, the presently-disclosed embodiments are not limited to such structures. Crack trapping structures, as described above in various embodiments, can be used in the inhibition or prevention of crack propagation in any layered structure or laminate such as a packaging structure or a printed circuit board.

As used herein, the singular forms "a," "an" and "the" include plural referents unless the context clearly dictates otherwise. Thus, for example, reference to a "metallic plate" includes examples having two or more such "metallic plates" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a crack trapping structure that comprises copper include embodiments where a crack trapping structure consists essentially of copper and embodiments where a crack trapping structure consists of copper.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor chip, comprising:
   a semiconductor substrate including a device active area;
   plural dielectric layers disposed over the substrate peripheral to the device active area; and
   a crack trapping structure including a metallic plate extending around the device active area and through two or more of the dielectric layers, wherein the crack trapping structure is disposed between the device active area and a kerf region, a sidewall of the crack trapping structure includes a notch facing the kerf region, and the metallic plate comprises copper.

2. The semiconductor chip according to claim 1, wherein the metallic plate extends through each of the dielectric layers peripheral to the device active area.

3. The semiconductor chip according to claim 1, wherein the metallic plate is in direct contact with the semiconductor substrate.

4. The semiconductor chip according to claim 1, wherein the plural dielectric layers extend laterally into the device active area.

5. The semiconductor chip according to claim 1, wherein the semiconductor chip includes a pair of concentric crack trapping structures.

6. The semiconductor chip according to claim 1, wherein the crack trapping structure comprises a plurality of metallic plates.

7. The semiconductor chip according to claim 1, wherein the crack trapping structure includes a substantially vertical sidewall facing the device active area.

8. The semiconductor chip according to claim 1, wherein a top surface of the notch abuts a first metallic plate, a bottom surface of the notch abuts a second metallic plate, and the first and second metallic plates each extend through two or more of the dielectric layers.

9. The semiconductor chip according to claim 1, wherein a top surface of the notch abuts a first metallic plate, a bottom surface of the notch abuts a second metallic plate, a first sidewall surface of the notch abuts a third metallic plate and a second sidewall surface of the notch abuts a fourth metallic plate.

10. The semiconductor chip according to claim 1, wherein the notch includes an airgap.

11. A method of forming a semiconductor chip, comprising:
   forming a device active area on a semiconductor substrate;
   forming a plurality of dielectric layers within the device active area, the plurality of dielectric layers extending laterally over the semiconductor substrate peripheral to the device active area;
   forming a via through the plurality of dielectric layers peripheral to the device active area and exposing the semiconductor substrate within the via; and
   forming a first metallic plate within the via, wherein the first metallic plate is disposed between the device active area and a kerf region, a sidewall of the first metallic plate includes a notch facing the kerf region, and the first metallic plate comprises copper.

12. The method of claim 11, wherein forming the first metallic plate comprises electroplating.

13. The method of claim 11, wherein the first metallic plate includes a substantially vertical sidewall facing the device active area.

14. The method of claim 11, further comprising forming a second metallic plate adjacent to and extending laterally from the first metallic plate.

15. The method of claim 14, wherein the first metallic plate defines a sidewall surface of the notch and the second metallic plate defines one of a top surface or a bottom surface of the notch.

16. The method of claim 11, wherein forming the first metallic plate comprises sputtering.

\* \* \* \* \*